Figure 1A:
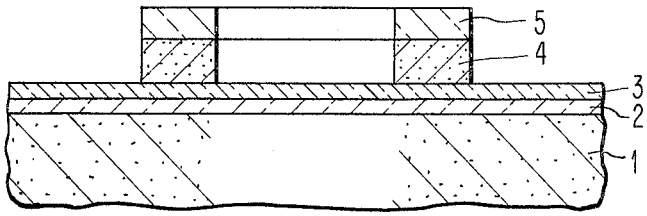
Figure 1B:
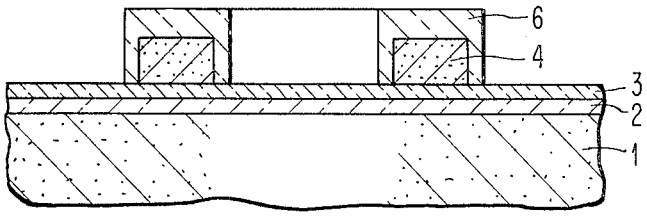
Figure 1C:
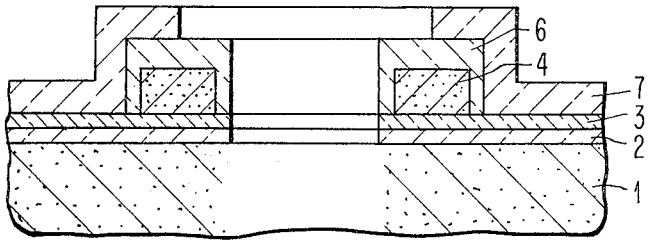
Figure 1D:
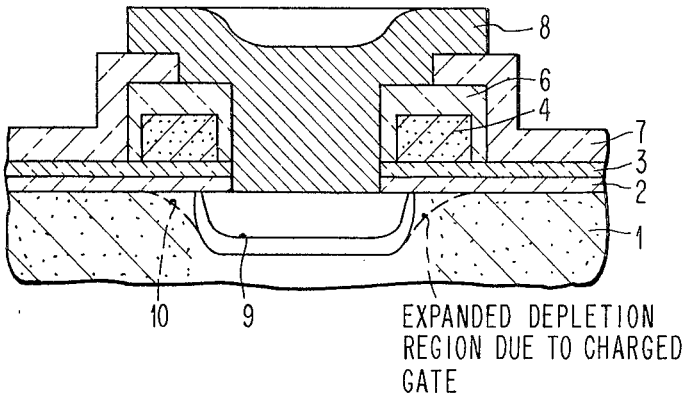
Figure 2:
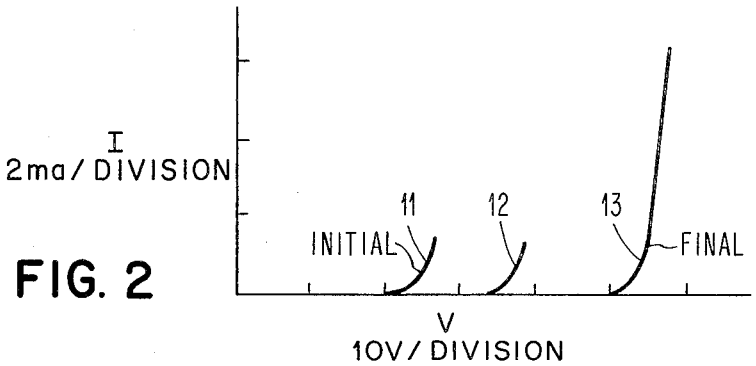

United States Defensive Publication [19] (H) [11] T953,005

Anantha et al. [43] Dec. 7, 1976

[54] SCHOTTKY BARRIER DIODE HAVING CHARGEABLE FLOATING GATE

[75] Inventors: Narasipur G. Anantha, Hopewell Junction; Robert C. Dockerty, Highland, both of N.Y.

[73] Assignee: International Business Machines Corporation, Armonk, N.Y.

[21] Appl. No.: 647,284

[22] Filed: Jan. 7, 1976

Related U.S. Application Data

[63] Continuation of Ser. No. 437,120, Jan. 28, 1974, abandoned.

[51] Int. Cl.[2] ..... H01L 29/48

[52] U.S. Cl. ..... 357/15; 357/13; 357/23; 357/52; 357/53; 357/59; 307/238

[57] ABSTRACT

A Schottky barrier diode having an encircling floating polycrystalline silicon gate which becomes charged upon avalanche breakdown of the diode. The gate is self-aligned with respect to the Schottky barrier diode metal so that the gate uniformly overhangs the depletion area in the semiconductor when the diode is reverse biased. The gate is insulated from the semiconductor material and from the metal by dielectric layers including silicon dioxide and silicon nitride.

6 Claims, 1 Sheet Drawing,

7 Pages Specification

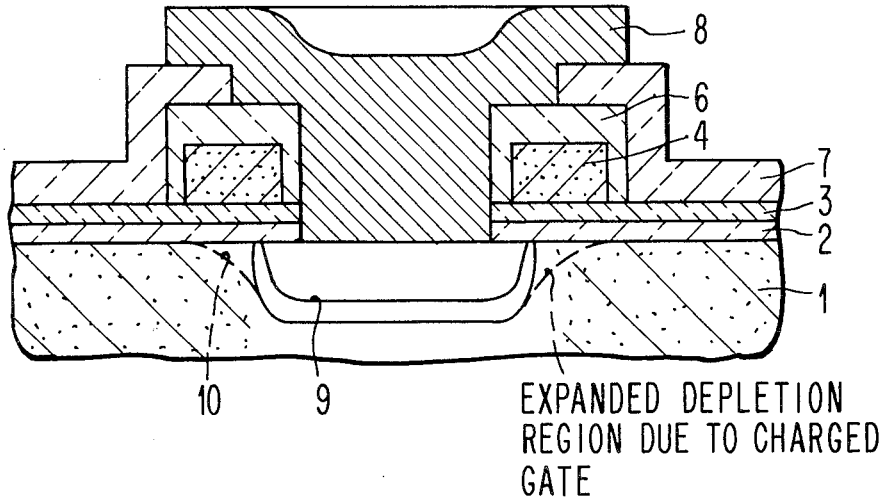

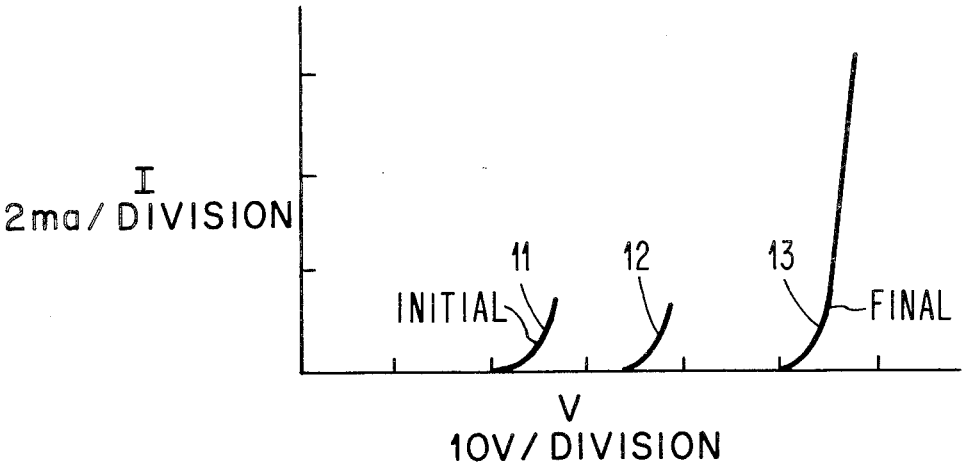

The file of this unexamined application may be inspected and copies thereof may be purchased (849 O.G. 1221, Apr. 9, 1968).